(12) United States Patent
Karasawa

(10) Patent No.: US 10,649,547 B2
(45) Date of Patent: May 12, 2020

(54) IMAGE PROJECTION SYSTEM, POINTING ELEMENT, AND METHOD FOR CONTROLLING IMAGE PROJECTION SYSTEM

(71) Applicant: SEIKO EPSON CORPORATION, Tokyo (JP)

(72) Inventor: Yukihiro Karasawa, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/299,649

(22) Filed: Mar. 12, 2019

(65) Prior Publication Data

US 2019/0286254 A1    Sep. 19, 2019

(30) Foreign Application Priority Data

Mar. 13, 2018   (JP) ................. 2018-045073

(51) Int. Cl.
| G06F 3/0354 | (2013.01) |
| G06F 3/042 | (2006.01) |
| G06F 3/03 | (2006.01) |
| G01R 31/371 | (2019.01) |
| G01R 31/382 | (2019.01) |

(52) U.S. Cl.
CPC ....... *G06F 3/03542* (2013.01); *G01R 31/371* (2019.01); *G01R 31/382* (2019.01); *G06F 3/0308* (2013.01); *G06F 3/0425* (2013.01)

(58) Field of Classification Search
CPC ... G06F 3/03542; G06F 3/0308; G06F 3/0425
See application file for complete search history.

(56) References Cited

U.S. PATENT DOCUMENTS

| 2008/0081007 A1 | 4/2008 | Steele et al. |
| 2012/0002215 A1* | 1/2012 | Takahashi ............. G06F 3/0416 356/614 |
| 2014/0123214 A1 | 5/2014 | Black et al. |

(Continued)

FOREIGN PATENT DOCUMENTS

| JP | 2014-191380 A | 10/2014 |
| JP | 2015-158887 A | 9/2015 |

(Continued)

*Primary Examiner* — Michael Pervan
(74) *Attorney, Agent, or Firm* — Oliff PLC

(57) ABSTRACT

An image projection system includes a projector and a light pen. The projector includes: an image pickup unit which performs image pickup in a periodically repeated image pickup period and does not perform image pickup in a non-image pickup period; a detection unit which detects a pointed position of the light pen; and an infrared signal receiving unit which receives pointing element information transmitted from the light pen. The light pen includes: a light emitting unit; a control unit; and a storage unit which stores the pointing element information. The light pen performs first light emission in the image pickup period and second light emission corresponding to the pointing element information in the non-image pickup period. The projector detects the pointed position, based on an image of the first light emission picked up by the image pickup unit and receives the pointing element information transmitted via the second light emission.

13 Claims, 5 Drawing Sheets

(56) References Cited

U.S. PATENT DOCUMENTS

| | | | |
|---|---|---|---|
| 2015/0205345 A1 | 7/2015 | Naess et al. | |
| 2016/0004337 A1 | 1/2016 | Nagao | |
| 2016/0253043 A1* | 9/2016 | Narikawa | G06F 3/03542 |
| | | | 348/744 |
| 2016/0291800 A1* | 10/2016 | Okabayashi | G06F 3/017 |
| 2017/0269717 A1* | 9/2017 | Yamano | G06F 3/033 |
| 2018/0217683 A1* | 8/2018 | Kobayashi | G06F 3/03 |

FOREIGN PATENT DOCUMENTS

| | | |
|---|---|---|
| JP | 2016-15649 A | 1/2016 |
| JP | 2016-500887 A | 1/2016 |
| JP | 2016-020542 A | 2/2016 |

* cited by examiner

IMAGE PROJECTION SYSTEM, POINTING ELEMENT, AND METHOD FOR CONTROLLING IMAGE PROJECTION SYSTEM

BACKGROUND

1. Technical Field

The present invention relates to an image projection system, a pointing element, and a method for controlling an image projection system.

2. Related Art

A projector which can pick up an image of light emitted from a pointing element such as a light pen and detect a pointed position pointed by the pointing element is known (see, for example, JP-A-2015-158887). The projector disclosed in JP-A-2015-158887 can also identify a plurality of pointing elements or detect the state of the switch at the tip of the pen, based on the light emission sequence (lighting pattern) of the pointing element, in addition to being able to detect the pointed position of the pointing element.

However, the amount of information that can be provided in the light emission sequence of the pointing element is limited. With the technique disclosed in JP-A-2015-158887, it is difficult to provide a larger amount of information (for example, the remaining capacity of the battery of the pointing element or the like) to the projector. Meanwhile, in the position detection system disclosed in JP-A-2016-020542, the pointing element can operate in a first mode for detecting the pointed position and can also operate in a second mode for notifying the user of the remaining capacity of the battery or the like. However, the technique disclosed in JP-A-2016-020542 has a problem in that the pointed position cannot be detected when the pointing element is operating in the second mode.

SUMMARY

An image projection system according to an aspect of the invention includes a projector and a pointing element. The projector includes: an image projection unit which projects an image; an image pickup unit which performs image pickup in a first period and does not perform image pickup in a second period, the first period and the second period being periodically repeated; a detection unit which detects a pointed position of the pointing element, based on an image picked up by the image pickup unit; and a receiving unit which receives pointing element information transmitted from the pointing element. The pointing element includes: a light emitting unit; a control unit which controls light emission of the light emitting unit; and a storage unit which stores the pointing element information. The control unit of the pointing element causes the light emitting unit to perform first light emission in the first period and causes the light emitting unit to perform second light emission corresponding to the pointing element information in the second period. The detection unit of the projector detects the pointed position, based on an image of the first light emission picked up by the image pickup unit. The receiving unit of the projector receives the pointing element information transmitted via the second light emission.

In the image projection system, it is desirable that the projector has a reporting unit which reports the pointing element information received by the receiving unit.

In the image projection system, it is desirable that the light emitting unit of the pointing element emits infrared light, that the image pickup unit of the projector picks up an image of the infrared light emitted from the light emitting unit in the first period, and that the receiving unit of the projector receives the pointing element information, based on the infrared light emitted from the light emitting unit in the second period.

In the image projection system, it is desirable that the pointing element has a battery and that the pointing element information is information representing a remaining capacity of the battery.

In the image projection system, it is desirable that the projector has an identification unit which identifies the pointing element, based on a timing when the light emitting unit performs the second light emission.

A pointing element according to another aspect of the invention includes: a light emitting unit; a control unit which controls light emission of the light emitting unit; and a storage unit which stores pointing element information. The control unit causes the light emitting unit to perform first light emission for detecting a pointed position of the pointing element in a first period and causes the light emitting unit to perform second light emission corresponding to the pointing element information in a second period, the first period and the second period being periodically repeated.

A method for controlling an image projection system according to still another aspect of the invention is a method for controlling an image projection system including a projector having an image pickup unit and a pointing element having a light emitting unit. The method includes: causing the pointing element to cause the light emitting unit to perform first light emission in a first period in which the image pickup unit performs image pickup, and to cause the light emitting unit to perform second light emission corresponding to pointing element information in a second period in which the image pickup unit does not perform image pickup, the first period and the second period being periodically repeated; and causing the projector to detect a pointed position of the pointing element, based on an image of the first light emission picked up by the image pickup unit, and to receive the pointing element information transmitted via the second light emission from the pointing element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
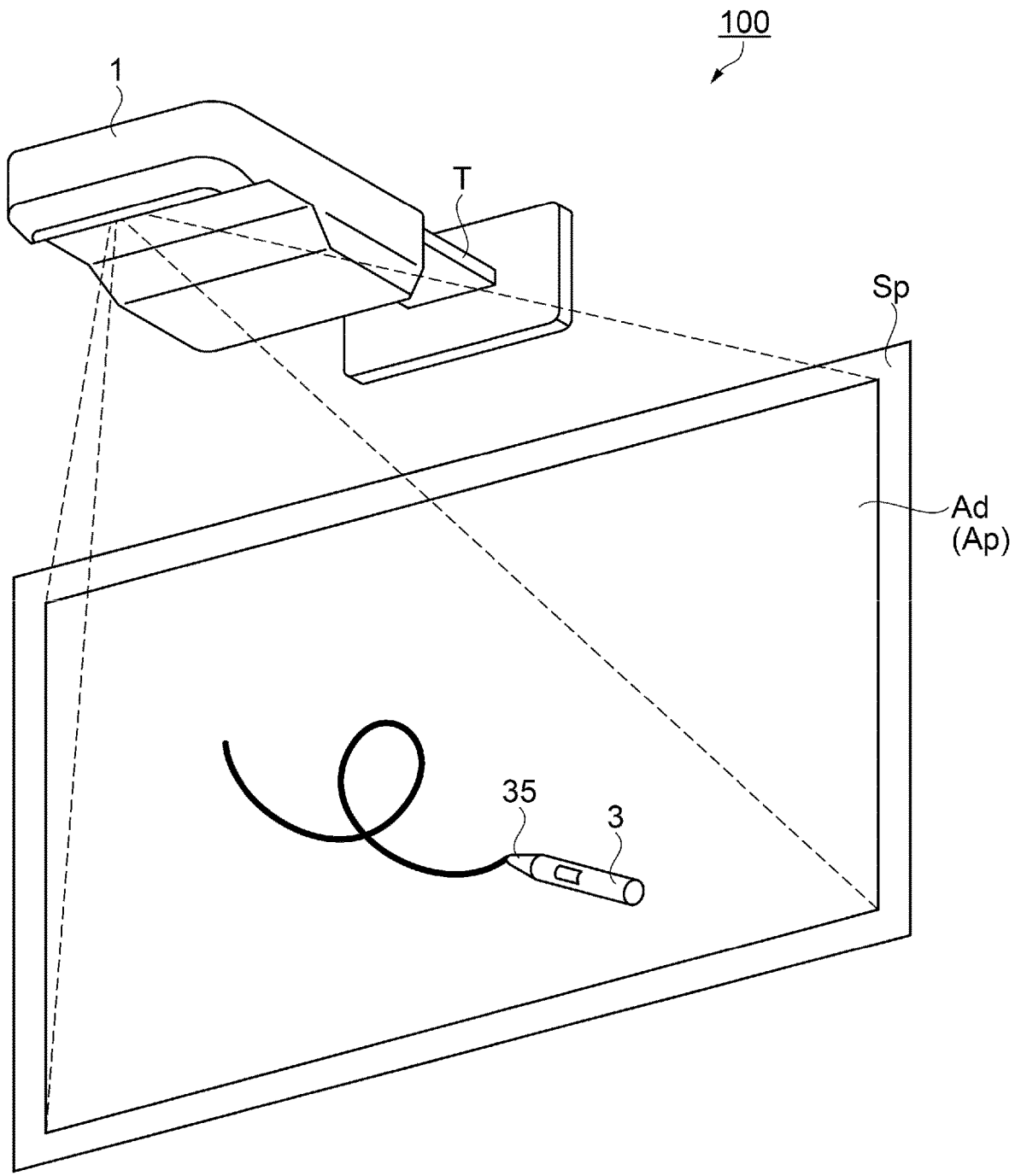
FIG. 1 is a perspective view showing an image projection system.

Hereinafter, an image projection system according to this embodiment will be described with reference to the drawings. FIG. 1 is a perspective view showing an image projection system 100 according to this embodiment. As shown in FIG. 1, the image projection system 100 has a projector 1 as an image display device and a light pen 3 as a pointing element. The projector 1 projects an image (hereinafter referred to as an "input image") based on image information inputted from outside or image information stored inside in advance, onto a projection surface Sp as a display surface. The projector 1 in this embodiment is fixed to a wall surface via a fastening member T and projects an image toward the projection surface Sp arranged along the same wall surface. The projection surface Sp can be, for example, a screen or whiteboard. However, an image may be projected on the wall surface itself.

The projector 1 can also pick up an image over a range including a detection area Ad on the projection surface Sp. The projector 1 picks up an image of infrared light emitted from a light emitting unit 35 at the distal end of the light pen 3 and detects a position (pointed position) pointed by the light pen 3 within the detection area Ad. The projector 1 can then display a pointer at the detected pointed position or display an image such as a line drawn along the trajectory of the pointed position (hereinafter also referred to as a "drawn image") as superimposed on the input image.

In this embodiment, the detection area Ad, where the pointed position can be detected, is equal to a projection area Ap where an image is projected from the projector 1. However, the detection area Ad may be broader or narrower than the projection area Ap. While the light pen 3 in this embodiment emits infrared light, the light pen 3 may emit light in other wavelength ranges.

Figure 2:
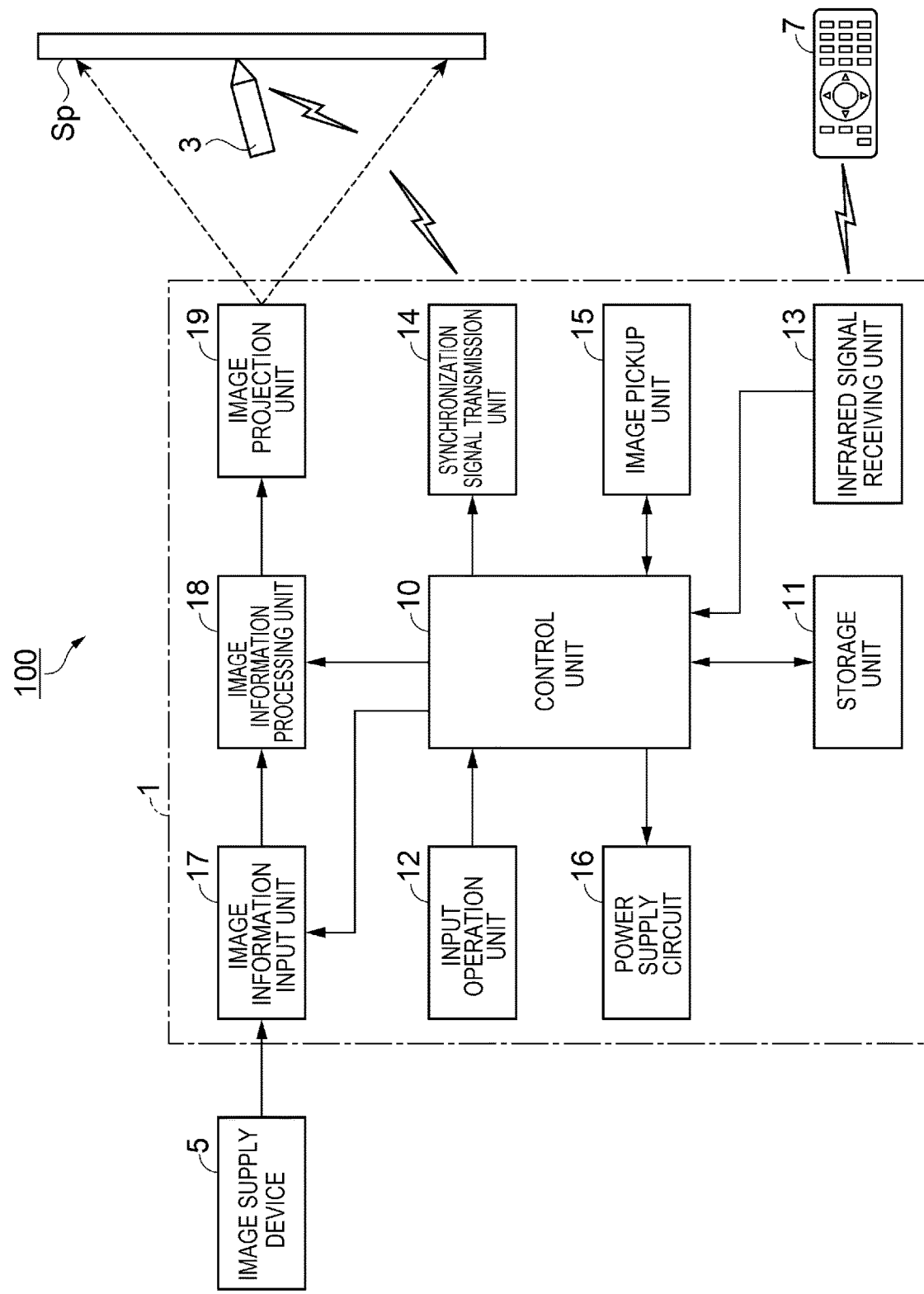
FIG. 2 is a block diagram showing a schematic configuration of a projector.
Figure 3:
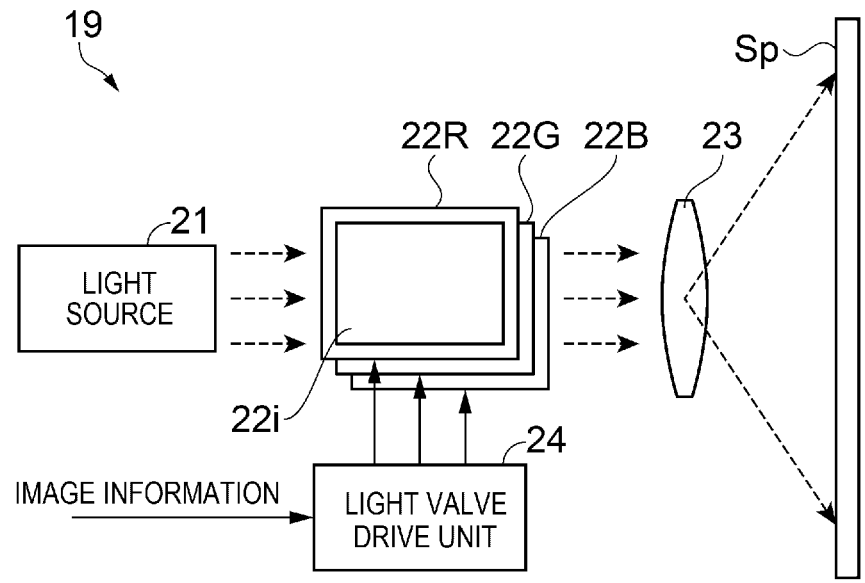
FIG. 3 is a block diagram showing a schematic configuration of an image projection unit of the projector.

FIG. 2 is a block diagram showing a schematic configuration of the projector 1. FIG. 3 is a block diagram showing a schematic configuration of an image projection unit 19 of the projector 1. As shown in FIG. 2, the projector 1 has a control unit 10, a storage unit 11, an input operation unit 12, an infrared signal receiving unit 13 as a receiving unit, a synchronization signal transmission unit 14, an image pickup unit 15, a power supply circuit 16, an image information input unit 17, an image information processing unit 18, and an image projection unit 19 as a display unit, which are provided in a unified manner. The projector 1 projects an image onto the projection surface Sp from the image projection unit 19, based on image information inputted to the image information input unit 17.

The control unit 10 has one or a plurality of processors and operates according to a control program stored in the storage unit 11, thus comprehensively controlling operations of the projector 1.

The storage unit 11 has a memory such as a RAM (random access memory) and a ROM (read-only memory). The RAM is used to temporarily store various data or the like. The ROM stores the control program and control data or the like to control operations of the projector 1. The storage unit 11 may also store image information to be projected from the image projection unit 19.

The input operation unit 12 has a plurality of operation keys for a user to give various instructions to the projector 1. The operation keys provided on the input operation unit 12 include a "power key" to switch the power between on and off (standby), a "menu key" to display a menu image for various settings, a "direction key" to select an item on the menu image, and the like. As the user operates the various operation keys on the input operation unit 12, the input operation unit 12 outputs an operation signal corresponding to the content of the operation by the user, to the control unit 10.

The infrared signal receiving unit 13 receives an operation signal sent from a remote controller 7 for remotely controlling the projector 1, and outputs the operation signal to the control unit 10. On the remote controller 7, a plurality of operation keys is arranged. As the user operates an operation key on the remote controller 7, the remote controller 7 transmits an operation signal corresponding to the operated operation key, via infrared light modulated with a predetermined carrier frequency (in this embodiment, about 38 kHz). The infrared signal receiving unit 13 has a band-pass filter which transmits this carrier frequency. The infrared signal receiving unit 13 receives the operation signal transmitted from the remote controller 7 and outputs the operation signal to the control unit 10. The light pen 3 in this embodiment can transmit battery information representing the remaining capacity of the battery of the light pen 3, as pointing element information. The battery information is transmitted via infrared light modulated with the carrier frequency. In this case, the infrared signal receiving unit 13 receives the battery information transmitted from the light pen 3 and outputs the battery information to the control unit 10.

The synchronization signal transmission unit 14 has a light emitting unit to transmit a signal for synchronization (synchronization signal) to the light pen 3. As the light source of the light emitting unit, for example, an LED (light emitting diode) which emits infrared light is used. The synchronization signal transmission unit 14 causes the light emitting unit to periodically emit light under the control of the control unit 10 and transmits a synchronization signal to the light pen 3. The light pen 3 periodically receives this synchronization signal and causes the light emitting unit 35 to repeatedly emit light at a timing synchronized with the received synchronization signal.

If a plurality of projectors 1 are arranged closely to each other and the synchronization signal transmission units 14 of the individual projectors 1 transmit a synchronization signal at different timings, the operation of the light pen 3 located at a position where the light pen 3 can receive these synchronization signals becomes unstable. Therefore, if a plurality of projectors 1 are arranged closely to each other, the plurality of projectors 1 are configured to transmit a synchronization signal at the same timing. Specifically, the synchronization signal transmission unit 14 transmits a synchronization signal via infrared light modulated with the same carrier frequency (about 38 kHz) as the remote controller 7. This enables the infrared signal receiving unit 13 of the other projector(s) 1 to receive this synchronization signal. If the infrared signal receiving unit 13 receives a synchronization signal transmitted from the other projector(s) 1, the synchronization signal transmission unit 14 transmits a synchronization signal at the same timing as the received synchronization signal.

The image pickup unit 15 is a camera having an image pickup element (not illustrated) such as a CCD (charge-coupled device) sensor or a CMOS (complementary metal-oxide semiconductor) sensor. The image pickup unit 15 has an infrared transmission filter absorbing visible light and transmitting infrared light and picks up an image of infrared light emitted from the light pen 3, via this infrared transmission filter. The image pickup unit 15 picks up an image of the detection area Ad on the projection surface Sp under the control of the control unit 10 and outputs image information (picked-up image information), which is the result of the image pickup, to the control unit 10. The control unit 10 causes the image pickup unit 15 to pick up an image at a timing synchronized with the synchronization signal transmitted from the synchronization signal transmission unit 14.

That is, the image pickup unit 15 repeats image pickup in accordance with the timing when the light pen 3 emits light.

The power supply circuit 16 is supplied with mains electricity (not illustrated) of AC 100 V or the like from outside. The power supply circuit 16 converts mains electricity (AC power supply) to a DC power supply of a predetermined voltage and supplies electric power to each part of the projector 1 (the supply route to each part is not illustrated). The control unit 10 can control the power supply circuit 16 to start and stop supplying electric power to each part.

The image information input unit 17 is connected to an external image supply device 5 such as a computer or image playback device and receives image information supplied from the image supply device 5. The image information input unit 17 can also be supplied with image information stored in the storage unit 11, from the control unit 10. The image information input unit 17 outputs the inputted image information, that is, image information representing an input image, to the image information processing unit 18.

The image information processing unit 18, under the control of the control unit 10, performs various kinds of processing on the image information inputted from the image information input unit 17 and outputs the processed image information to a light valve drive unit 24 (see FIG. 3) of the image projection unit 19. For example, the image information processing unit 18 performs, on the image information, processing to adjust image quality such as brightness and contrast, processing to superimpose an OSD (on-screen display) image such as a drawn image or menu image onto the input image, and the like, according to need.

The image information input unit 17 and the image information processing unit 18 may be made up of one or a plurality of processors or the like, or may be made up of a dedicated processing device such as an ASIC (application specific integrated circuit) or FPGA (field-programmable gate array).

As shown in FIG. 3, the image projection unit 19 has a light source 21, three liquid crystal light valves 22R, 22G, 22B as light modulation devices, a projection system 23, and a light valve drive unit 24 or the like. In the image projection unit 19, the liquid crystal light valves 22R, 22G, 22B modulate light emitted from the light source 21 and thus form image light, and the projection system 23 including at least one of a lens and a mirror projects the image light to display an image on the projection surface Sp.

The light source 21 includes a discharge-type light source lamp such as an ultra-high-pressure mercury lamp or metal halide lamp, or a solid-state light source such as a light-emitting diode or semiconductor laser. The light emitted from the light source 21 is converted into light with substantially uniform luminance distribution by an optical integration system, not illustrated. The light is then separated into individual color light components of red (R), green (G), and blue (B) by a color separation system, not illustrated. The individual color light components become incident on the corresponding liquid crystal light valves 22R, 22G, 22B.

Each of the liquid crystal light valves 22R, 22G, 22B is made up of a transmission-type liquid crystal panel having a pair of transparent substrates with a liquid crystal enclosed between them. On each liquid crystal panel, a rectangular image forming area 22i made up of a plurality of pixels arranged into a matrix is formed. A drive voltage can be applied to the liquid crystal at each pixel.

The light valve drive unit 24 forms an image in the image forming area 22i of the liquid crystal light valves 22R, 22G, 22B. Specifically, the light valve drive unit 24 applies a drive voltage corresponding to image information inputted from the image information processing unit 18, to each pixel in the image forming area 22i, and thus sets each pixel to a light transmittance corresponding to the image information. The light emitted from the light source 21 is transmitted through the image forming area 22i of the liquid crystal light valves 22R, 22G, 22B and thus modulated at each pixel. Image light corresponding to the image information is thus formed for each color light component. The resulting image lights of the individual colors are combined at each pixel by a light combining system, not illustrated, and thus form image light representing a color image. The image light is then projected in an enlarged manner on the projection surface Sp by the projection system 23. Consequently, an image based on the image information inputted to the image information input unit 17 is displayed on the projection surface Sp.

Figure 4:
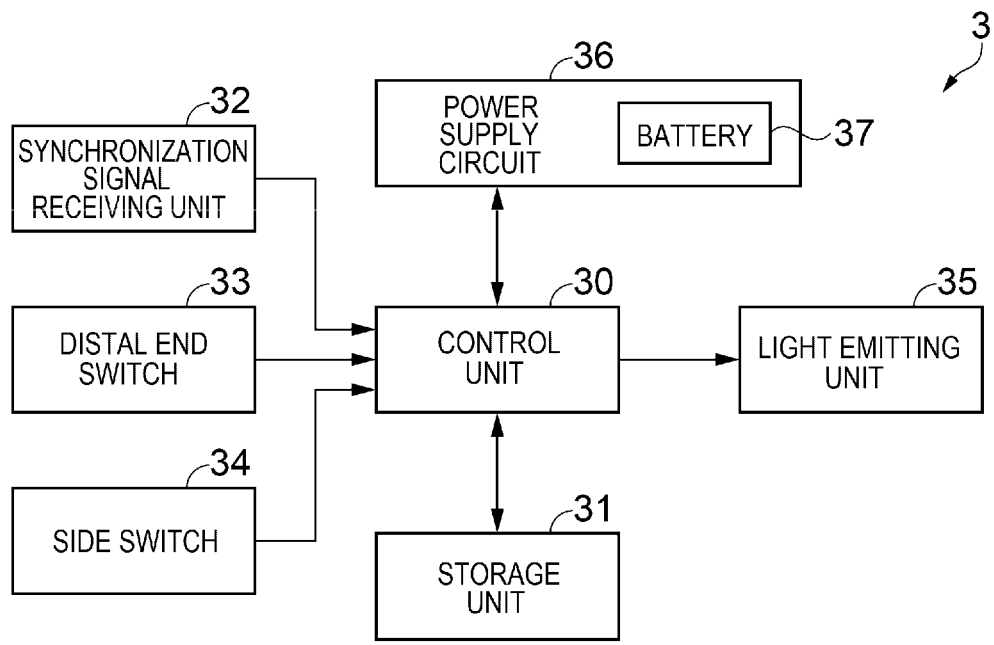
FIG. 4 is a block diagram showing a schematic configuration of a light pen.

FIG. 4 is a block diagram showing a schematic configuration of the light pen 3. As shown in FIG. 4, the light pen 3 has a control unit 30, a storage unit 31, a synchronization signal receiving unit 32, a distal end switch 33, a side switch 34, a light emitting unit 35, and a power supply circuit 36. The power supply circuit 36 includes a battery 37.

The control unit 30 has one or a plurality of processors. The control unit 30 operates according to a control program stored in the storage unit 31 and thus comprehensively controls operations of the light pen 3.

The storage unit 31 is made up of a memory which stores the control program and control data or the like for controlling operations of the light pen 3. In the storage unit 31 in this embodiment, battery information representing the remaining capacity of the battery 37 is stored. The control unit 30 causes the power supply circuit 36 to periodically measure the remaining capacity of the battery 37 and updates the battery information stored in the storage unit 31, as required.

The synchronization signal receiving unit 32 is made up of a light receiving element or the like which receives infrared light. The synchronization signal receiving unit 32 receives an infrared synchronization signal transmitted periodically from the synchronization signal transmission unit 14 of the projector 1 and outputs the synchronization signal to the control unit 30.

The distal end switch 33 is arranged at a distal end part (tip) of the light pen 3. When an operation of pressing the distal end part against the projection surface Sp is carried out or the like, the distal end switch 33 detects the pressing of the distal end part and outputs the result of the detection to the control unit 30.

The side switch 34 detects an operation (pressing) by the user on an operation button arranged on the lateral side of the light pen 3 and outputs the result of the detection to the control unit 30.

The light emitting unit 35 has a light source (for example, LED) arranged near the distal end part of the light pen 3 and emits infrared light under the control of the control unit 30. The control unit 30 causes the light emitting unit 35 to repeatedly emit light synchronously with the synchronization signal received periodically by the synchronization signal receiving unit 32.

The power supply circuit 36 converts DC power supplied from the battery 37 into a predetermined voltage and supplies electric power to each part of the light pen 3 (the supply route to each part is not illustrated). The control unit 30 can control the power supply circuit 36 to start and stop supplying electric power to each part. Also, the power supply circuit 36, under the control of the control unit 30, measures the remaining capacity of the battery 37 and outputs the result of the measurement to the control unit 30. The battery 37 is, for example, a primary battery accommodated in a replaceable manner and supplies electric power to the power supply circuit 36. Also, a rechargeable secondary battery may be employed as the battery 37.

Figure 5:
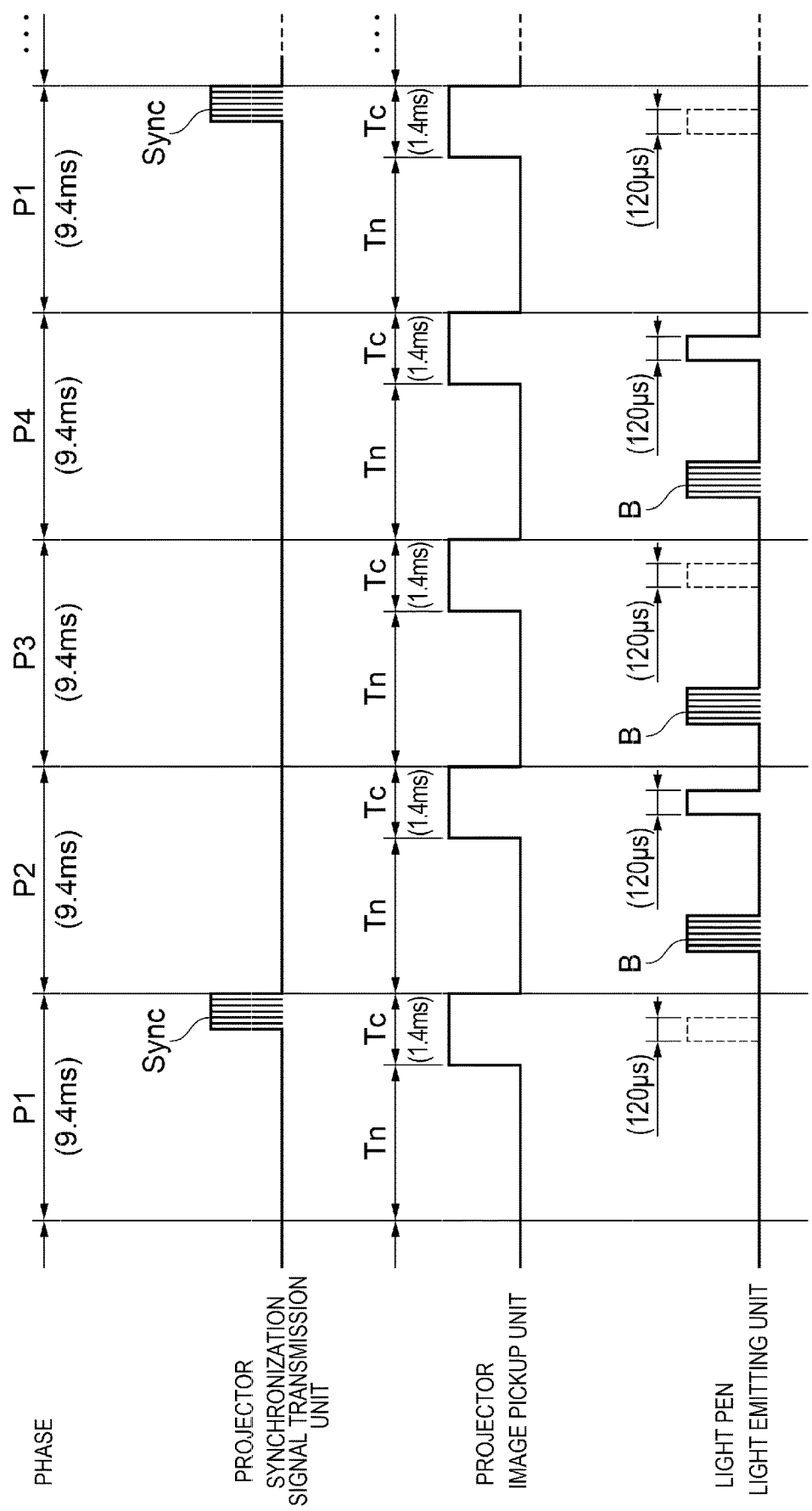
FIG. 5 is a timing chart showing operation timings of the projector and the light pen.

FIG. 5 is a timing chart showing operation timings of the projector 1 and the light pen 3 and showing, from the top, the timing when the synchronization signal transmission unit 14 of the projector 1 transmits a synchronization signal Sync (emits light), the timing when the image pickup unit 15 of the projector 1 performs image pickup, and the timing when the light emitting unit 35 of the light pen 3 emits light. In FIG. 5, the horizontal axis is the time axis, and the vertical axis represents each operation state.

As shown in FIG. 5, the image pickup unit 15 of the projector 1 repeats image pickup on a predetermined cycle (for example, on a cycle of about 9.4 milliseconds). If the cycle of image pickup is called a "phase", the projector 1 and the light pen 3 repeat similar operations every reference period made up of four phases, that is, a first phase P1, a second phase P2, a third phase P3, and a fourth phase P4.

The first phase P1 is a phase for synchronization. In the first phase P1, the synchronization signal transmission unit 14 of the projector 1 transmits the synchronization signal Sync to the light pen 3. The image pickup unit 15 of the projector 1 performs image pickup during a predetermined image pickup period Tc in each of the phases P1 to P4, synchronously with the synchronization signal Sync. The image pickup period Tc (exposure time) of the image pickup unit 15 in each of the phases P1 to P4 is, for example, a period of approximately 1.4 milliseconds. The image pickup unit 15 does not perform image pickup in the other periods (non-image pickup periods Tn).

In the light pen 3, the synchronization signal receiving unit 32 receives the synchronization signal Sync in the first phase P1. The control unit 30 of the light pen 3 causes the light emitting unit 35 to emit light at the timing synchronized with the received synchronization signal Sync. Specifically, the control unit 30 causes the light emitting unit 35 to emit light during the image pickup period Tc of the image pickup unit 15 so that the image pickup unit 15 picks up an image of the light emitted from the light emitting unit 35. More specifically, the control unit 30 causes the light emitting unit 35 to emit light during a period of 120 microseconds included in the image pickup period Tc.

During the image pickup period Tc in the second phase P2 and the fourth phase P4, of the four phases P1 to P4, the control unit 30 causes the light emitting unit 35 to emit light without exception. During the image pickup period Tc in the first phase P1 and the third phase P3, the control unit 30 causes the light emitting unit 35 to emit light or not to emit light, based on the state of the distal end switch 33 and the side switch 34 (whether the switch is pressed or not). The control unit 30 notifies the projector 1 of the state of the distal end switch 33 and the state of the side switch 34, based on the transition of the light emission state (hereinafter referred to as a "light emission sequence") of the light emitting unit 35 in the first phase P1 and the third phase P3 over a plurality of reference periods.

An image of the light emitted from the light emitting unit 35 of the light pen 3 during the image pickup period Tc is picked up by the image pickup unit 15 of the projector 1. The control unit 10 of the projector 1 detects the position (pointed position) of the light pen 3, based on the position of the light whose image is picked up in the second phase P2 and the fourth phase P4. The control unit 10 also recognizes the state of the distal end switch 33 and the side switch 34 of the light pen 3, based on the light emission sequence of the light whose image is picked up in the first phase P1 and the third phase P3.

In this embodiment, the control unit 30 of the light pen 3 causes the light emitting unit 35 to emit light, based on the battery information stored in the storage unit 31, during the non-image pickup period Tn, during which the image pickup unit 15 does not perform image pickup. For example, the control unit 30 provides the battery information (the remaining capacity of the battery) in the form of 3-bit information, and transmits the battery information, based on whether light emission (signal B) is present or not during the non-image pickup period Tn in the three phases of the second phase P2, the third phase P3, and the fourth phase P4. At this time, the control unit 30 causes the light emitting unit 35 to emit light with the same carrier frequency (about 38 kHz) as the remote controller 7 and thus transmits the signal B (battery information).

The battery information transmitted from the light emitting unit 35 of the light pen 3 is received by the infrared signal receiving unit 13 of the projector 1 and outputted to the control unit 10. The period when the battery information is transmitted is the non-image pickup period Tn, during which the image pickup unit 15 does not perform image pickup. On receiving the battery information, the control unit 10, for example, instructs the image information processing unit 18 to display an OSD image showing the battery information of the light pen 3 as superimposed on an input image and thus reports the remaining capacity of the battery of the light pen 3 to the user.

In this way, the projector 1 acquires information transmitted from the light pen 3 via the image pickup unit 15 during the image pickup period Tc and via the infrared signal receiving unit 13 during the non-image pickup period Tn. That is, during the non-image pickup period Tn, the projector 1 receives the information transmitted from the light pen 3 via the infrared signal receiving unit 13, which is for receiving an operation signal from the remote controller 7. Therefore, no additional measures to acquire information during the non-image pickup period Tn are needed.

Figure 6:
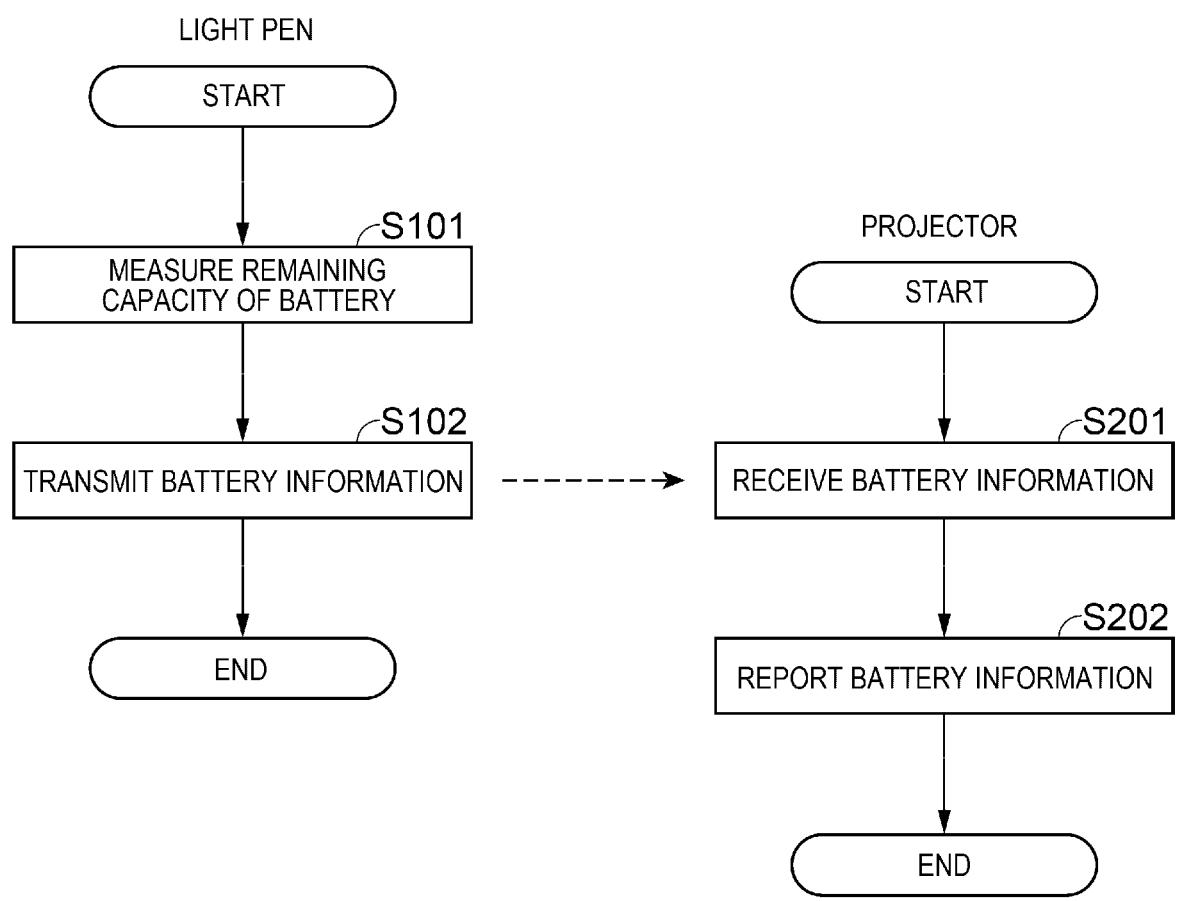
FIG. 6 is a flowchart for explaining operations of the image projection system.

FIG. 6 is a flowchart for explaining operations of the image projection system 100. As shown in FIG. 6, in step S101, the control unit 30 of the light pen 3 instructs the power supply circuit 36 to measure the remaining capacity of the battery 37. The control unit 30 acquires the measured remaining capacity of the battery 37 and causes the storage unit 31 to store the remaining capacity as battery information. Next, in step S102, the control unit 30 transmits the battery information stored in the storage unit 31 to the projector 1, using the non-image pickup period Tn of the image pickup unit 15, and then ends the flow.

Meanwhile, in step S201, the infrared signal receiving unit 13 of the projector 1 receives the battery information transmitted from the light pen 3 and outputs the battery information to the control unit 10. In step S202, the control unit 10 causes the image information processing unit 18 to display an OSD image, based on the received battery information, thus reports the remaining capacity of the battery to the user, and then ends the flow. The light pen 3 and the projector 1 periodically repeat the flows.

As described above, the image projection system 100, the light pen 3, and the method for controlling these according to this embodiment can achieve the following effects.

(1) In this embodiment, the control unit 30 of the light pen 3 causes the light emitting unit 35 to perform light emission for detecting the pointed position during the image pickup period Tc, during which the image pickup unit 15 performs image pickup, and the control unit 30 causes the light emitting unit 35 to perform light emission corresponding to the battery information during the non-image pickup period Tn, during which the image pickup unit 15 does not perform image pickup, where the image pickup period Tc and the non-image pickup period Tn are periodically repeated. Thus, the projector 1 can acquire the battery information transmitted from the light pen 3 while periodically detecting the pointed position of the light pen 3.

(2) In this embodiment, the projector 1 reports the received battery information via an OSD image and therefore can allow the user to recognize the remaining capacity of the battery 37.

(3) In this embodiment, the projector 1 detects the pointed position and receives the battery information, using the infrared light emitted from the light pen 3. Therefore, the user does not visually recognize the light emitted from the light pen 3.

(4) In this embodiment, the light pen 3 transmits the battery information representing the remaining capacity of the battery 37 to the projector 1. Therefore, the projector 1 can perform an operation (control) corresponding to the remaining capacity of the battery 37, such as reporting the remaining capacity of the battery 37 to the user.

In the embodiment, the control unit 10 when detecting the pointed position of the light pen 3, based on the position of light whose image is picked up by the image pickup unit 15 in the second phase P2 and the fourth phase P4, is equivalent to the detection unit. The control unit 10, the image information processing unit 18, and the image projection unit 19 when reporting the remaining capacity of the battery to the user via an OSD image, based on the battery information received from the light pen 3, are equivalent to the reporting unit. The image pickup period Tc and the non-image pickup period Tn, which are periodically repeated, are equivalent respectively to the first period and the second period. The light emission of the light emitting unit 35 performed in the image pickup period Tc is equivalent to the first light emission for detecting the pointed position. The light emission of the light emitting unit 35 performed in the non-image pickup period Tn is equivalent to the second light emission corresponding to the battery information.

MODIFICATIONS

The embodiment may be modified as follows.

In the embodiment, the light pen 3 transmits the battery information over the three phases P2 to P4. However, the light pen 3 may transmit the battery information in one phase only. For example, a plurality of signals B may be included in one phase, or the length (duration) of the signal B may express the remaining capacity of the battery. Also, the light pen 3 may transmit the battery information over a plurality of reference periods.

In the embodiment, the timing when the light pen 3 transmits the battery information is not particularly limited. For example, the light pen 3 may transmit the battery information constantly (that is, throughout all the reference period) or may transmit the battery information intermittently on a predetermined cycle. Also, the light pen 3 may transmit the battery information in response to a particular trigger in cases such as when the side switch 34 is operated or when the remaining capacity of the battery decreases by a predetermined amount.

In the embodiment, if a plurality of light pens 3 can be used with one projector 1, identification information to identify the light pens 3 may be transmitted with the battery information. Changing the timing when the light pen 3 emits light during the non-image pickup period Tn, that is, the timing when the light pen 3 outputs the signal B, according to the identification information, enables the control unit 10 of the projector 1 to identify the light pen 3, based on the timing when the signal B is outputted. In this case, the control unit 10 functions as the identification unit which identifies the light pen 3. This configuration eliminates the need to transmit the identification information to identify the light pen 3.

In the embodiment, the light pen 3 transmits the battery information representing the remaining capacity of the battery 37 as the pointing element information. However, the pointing element information transmitted from the light pen 3 to the projector 1 is not limited to the battery information. For example, the light pen 3 may transmit the pressing state of the distal end switch 33 and the side switch 34 or the like as the pointing element information, or may transmit version information representing the version of the control program stored in the storage unit 31.

In the embodiment, the projector 1 reports the remaining capacity of the battery 37 to the user by projecting an OSD image from the image projection unit 19, based on the battery information received from the light pent 3. However, the way to report the pointing element information such as the battery information is not limited to this configuration. For example, the projector 1 may report the pointing element information via a display unit separate from the image projection unit 19 or via a sound. The projector 1 may also report a message prompting the user to replace or recharge the battery 37, based on the received battery information. In the configuration where the light pen 3 transmits the pressing state of the side switch 34 or the version information of the control program or the like as the pointing element information, the operation (control) of the projector 1 may change according to the pointing element information and there is no need to report the pointing element information to the user.

In the embodiment, the transmission-type liquid crystal light valves 22R, 22G, 22B are used as light modulation devices. However, a reflection-type light modulation device such as a reflection-type liquid crystal light valve can be used. Also, a digital mirror device or the like which controls the exit direction of incident light for each micromirror as a pixel so as to modulate light emitted from the light source 21 may be used. Moreover, the configuration having a plurality of light modulation devices corresponding to individual color light components is not limiting. A single light modulation device may modulate a plurality of color light components in time division.

In the embodiment, the projector 1 is described as an example of the image display device. However, the image display device is not limited to the projector 1 and may be another type of image display device such as a liquid crystal display or organic EL display.

Contents derived from the embodiment will be described below.

An image projection system includes a projector and a pointing element. The projector includes: an image projection unit which projects an image; an image pickup unit which performs image pickup in a first period and does not perform image pickup in a second period, the first period and the second period being periodically repeated; a detection unit which detects a pointed position of the pointing element, based on an image picked up by the image pickup unit; and a receiving unit which receives pointing element information transmitted from the pointing element. The pointing element includes: a light emitting unit; a control unit which controls light emission of the light emitting unit; and a storage unit which stores the pointing element information. The control unit causes the light emitting unit to perform first light emission in the first period and causes the light emitting unit to perform second light emission corresponding to the pointing element information in the second period. The detection unit detects the pointed position, based on an image of the first light emission picked up by the image pickup unit. The receiving unit receives the pointing element information transmitted via the second light emission.

In this configuration, the control unit of the pointing element causes the light emitting unit to perform the first light emission for detecting the pointed position, in the first period, in which the image pickup unit performs image pickup, and the control unit causes the light emitting unit to perform the second light emission corresponding to the pointing element information in the second period, in which the image pickup unit does not perform image pickup, with the first period and the second period being periodically repeated. Thus, the projector can acquire the pointing element information transmitted from the pointing element, while periodically detecting the pointed position of the pointing element.

In the image projection system, it is desirable that the projector has a reporting unit which reports the pointing element information received by the receiving unit.

In this configuration, the projector has the reporting unit, which reports the received pointing element information. Thus, it is possible to allow the user to recognize the pointing element information.

In the image projection system, it is desirable that the light emitting unit emits infrared light, that the image pickup unit picks up an image of the infrared light emitted from the light emitting unit in the first period, and that the receiving unit receives the pointing element information, based on the infrared light emitted from the light emitting unit in the second period.

In this configuration, the projector detects the pointed position and receives the pointing element information, using the infrared light emitted from the pointing element. Therefore, the user does not visually recognize the light emitted from the pointing element.

In the image projection system, it is desirable that the pointing element has a battery and that the pointing element information is information representing a remaining capacity of the battery.

In this configuration, the pointing element transmits the information representing the remaining capacity of the battery to the projector. Thus, the projector can perform an operation (control) corresponding to the remaining capacity of the battery.

In the image projection system, it is desirable that the projector has an identification unit which identifies the pointing element, based on a timing when the light emitting unit performs the second light emission.

In this configuration, the projector has the identification unit, which identifies the pointing element, based on the timing of the second light emission. Thus, which pointing element the transmitted pointing element information corresponds to can be properly recognized.

A pointing element includes: a light emitting unit; a control unit which controls light emission of the light emitting unit; and a storage unit which stores pointing element information. The control unit causes the light emitting unit to perform first light emission for detecting a pointed position of the pointing element in a first period and causes the light emitting unit to perform second light emission corresponding to the pointing element information in a second period, the first period and the second period being periodically repeated.

In this configuration, the control unit causes the light emitting unit to perform the first light emission for detecting the pointed position of the pointing element in the first period and causes the light emitting unit to perform the second light emission corresponding to the pointing element information in the second period, with the first period and the second period being periodically repeated. Thus, the pointing element can transmit the pointing element information while allowing the pointed position to be periodically detected.

A method for controlling an image projection system is for an image projection system including a projector having an image pickup unit and a pointing element having a light emitting unit. The method includes: causing the pointing element to cause the light emitting unit to perform first light emission in a first period in which the image pickup unit performs image pickup, and to cause the light emitting unit to perform second light emission corresponding to pointing element information in a second period in which the image pickup unit does not perform image pickup, the first period and the second period being periodically repeated; and causing the projector to detect a pointed position of the pointing element, based on an image of the first light emission picked up by the image pickup unit, and to receive the pointing element information transmitted via the second light emission from the pointing element.

In this configuration, the pointing element causes the light emitting unit to perform the first light emission for detecting the pointed position, in the first period, in which the image pickup unit performs image pickup, and the pointing element causes the light emitting unit to perform the second light emission corresponding to the pointing element information in the second period, in which the image pickup unit does not perform image pickup, with the first period and the second period being periodically repeated. Thus, the projector can acquire the pointing element information transmitted from the pointing element, while periodically detecting the pointed position of the pointing element.

The entire disclosures of Japanese patent application no. JP 2018-045073 filed on Mar. 13, 2018 is expressly incorporated by reference herein.

What is claimed is:
1. An image projection system comprising:
a projector; and
a pointing element, wherein
the projector includes
   an image projection unit which projects an image;
   an image pickup unit which performs image pickup in a first period and does not perform image pickup in a second period, the first period and the second period being periodically repeated;
   a detection unit which detects a pointed position of the pointing element, based on an image picked up by the image pickup unit; and
   a receiving unit which receives pointing element information transmitted from the pointing element,
the pointing element includes
   a light emitting unit;
   a control unit which controls light emission of the light emitting unit; and a storage unit which stores the pointing element information, the control unit of the pointing element causes the light emitting unit to perform first light emission in the first period and causes the light emitting unit to perform second light emission corresponding to the pointing element information in the second period, the detection unit of the projector detects the pointed position, based on an image of the first light emission picked up by the image pickup unit, and the receiving unit of the projector receives the pointing element information transmitted via the second light emission.

2. The image projection system according to claim 1, wherein
the projector has a reporting unit which reports the pointing element information received by the receiving unit.

3. The image projection system according to claim 1, wherein
the light emitting unit of the pointing element emits infrared light,
the image pickup unit of the projector picks up an image of the infrared light emitted from the light emitting unit in the first period, and
the receiving unit of the projector receives the pointing element information, based on the infrared light emitted from the light emitting unit in the second period.

4. The image projection system according to claim 1, wherein
the pointing element has a battery, and
the pointing element information is information representing a remaining capacity of the battery.

5. The image projection system according to claim 1, wherein
the projector has an identification unit which identifies the pointing element, based on a timing when the light emitting unit performs the second light emission.

6. A pointing element comprising:
a light emitting unit;
a control unit which controls light emission of the light emitting unit; and
a storage unit which stores pointing element information,
wherein the control unit causes the light emitting unit to perform first light emission for detecting a pointed position of the pointing element in a first period and causes the light emitting unit to perform second light emission corresponding to the pointing element information in a second period, the first period and the second period being periodically repeated.

7. The pointing element according to claim 6, wherein the light emitting unit emits infrared light.

8. The pointing element according to claim 6, wherein the pointing element has a battery, and
the pointing element information is information representing a remaining capacity of the battery.

9. A method for controlling an image projection system including a projector having an image pickup unit and a pointing element having a light emitting unit, the method comprising:
causing the pointing element to cause the light emitting unit to perform first light emission in a first period in which the image pickup unit performs image pickup, and to cause the light emitting unit to perform second light emission corresponding to pointing element information in a second period in which the image pickup unit does not perform image pickup, the first period and the second period being periodically repeated; and
causing the projector to detect a pointed position of the pointing element, based on an image of the first light emission picked up by the image pickup unit, and to receive the pointing element information transmitted via the second light emission from the pointing element.

10. The method for controlling the image projection system according to claim 9, wherein
the projector reports the received pointing element information.

11. The method for controlling the image projection system according to claim 9, wherein
the pointing element emits infrared light,
the projector picks up an image of the infrared light emitted from the light emitting unit in the first period, and receives the pointing element information, based on the infrared light emitted from the light emitting unit in the second period.

12. The method for controlling the image projection system according to claim 9, wherein
the pointing element has a battery, and
the pointing element information is information representing a remaining capacity of the battery.

13. The method for controlling the image projection system according to claim 9, wherein
the projector identifies the pointing element, based on a timing when the light emitting unit performs the second light emission.

* * * * *